(12) United States Patent
Yu et al.

(10) Patent No.: US 12,283,951 B2
(45) Date of Patent: Apr. 22, 2025

(54) VOLTAGE PROVISION CIRCUITS WITH CORE TRANSISTORS

(71) Applicant: Taiwan Semiconductor Manufacturing Company, Ltd., Hsinchu (TW)

(72) Inventors: Ting-Yu Yu, Kaohsiung (TW); Meng-Sheng Chang, Chu-bei (TW); Shao-Yu Chou, Chu Pei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 79 days.

(21) Appl. No.: 18/170,408

(22) Filed: Feb. 16, 2023

(65) Prior Publication Data
US 2024/0146305 A1    May 2, 2024

Related U.S. Application Data

(60) Provisional application No. 63/419,958, filed on Oct. 27, 2022.

(51) Int. Cl.
*H03K 19/0185*     (2006.01)
*H03K 19/20*     (2006.01)

(52) U.S. Cl.
CPC ..... *H03K 19/018521* (2013.01); *H03K 19/20* (2013.01)

(58) Field of Classification Search
CPC .......... H03K 19/018521; H03K 19/20; H03K 19/018507; H03K 19/018528; H03K 5/003; H03K 19/0175; H03K 19/0185; G11C 5/147; G06F 3/00
See application file for complete search history.

(56) References Cited

U.S. PATENT DOCUMENTS

2005/0156631 A1*   7/2005   Huang ................ H03K 17/102
                                                                          326/81
2019/0020338 A1   1/2019   Chellamuthu et al.

FOREIGN PATENT DOCUMENTS

TW      201403611 A     1/2014
TW      202006493 A     2/2020
TW      202205821 A     2/2022

OTHER PUBLICATIONS

Office Action issued in connection with Taiwan Appl. No. 112126778 dated May 27, 2024.

* cited by examiner

*Primary Examiner* — Jung Kim
(74) *Attorney, Agent, or Firm* — FOLEY & LARDNER LLP

(57) ABSTRACT

A voltage provision circuit includes a first NMOS transistor gated with a first control signal and sourced with a ground voltage, a second NMOS transistor gated with a second control signal complementary to the first control signal and sourced with the ground voltage, a first PMOS transistor sourced with a first supply voltage, a second PMOS transistor sourced with the first supply voltage, and a voltage modulation circuit that is coupled between the first to second PMOS transistors and the first to second NMOS transistors, and is configured to provide a first intermediate signal based on the first and second control signals. The first intermediate signal has a first logic state corresponding to the first supply voltage and a second logic state corresponding to a second supply voltage that is a fraction of the first supply voltage.

20 Claims, 9 Drawing Sheets

VOLTAGE PROVISION CIRCUITS WITH CORE TRANSISTORS

CROSS-REFERENCE TO RELATED APPLICATIONS

The present application claims the benefit of and priority to U.S. Provisional Patent App. No. 63/419,958, the entire disclosure of which is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
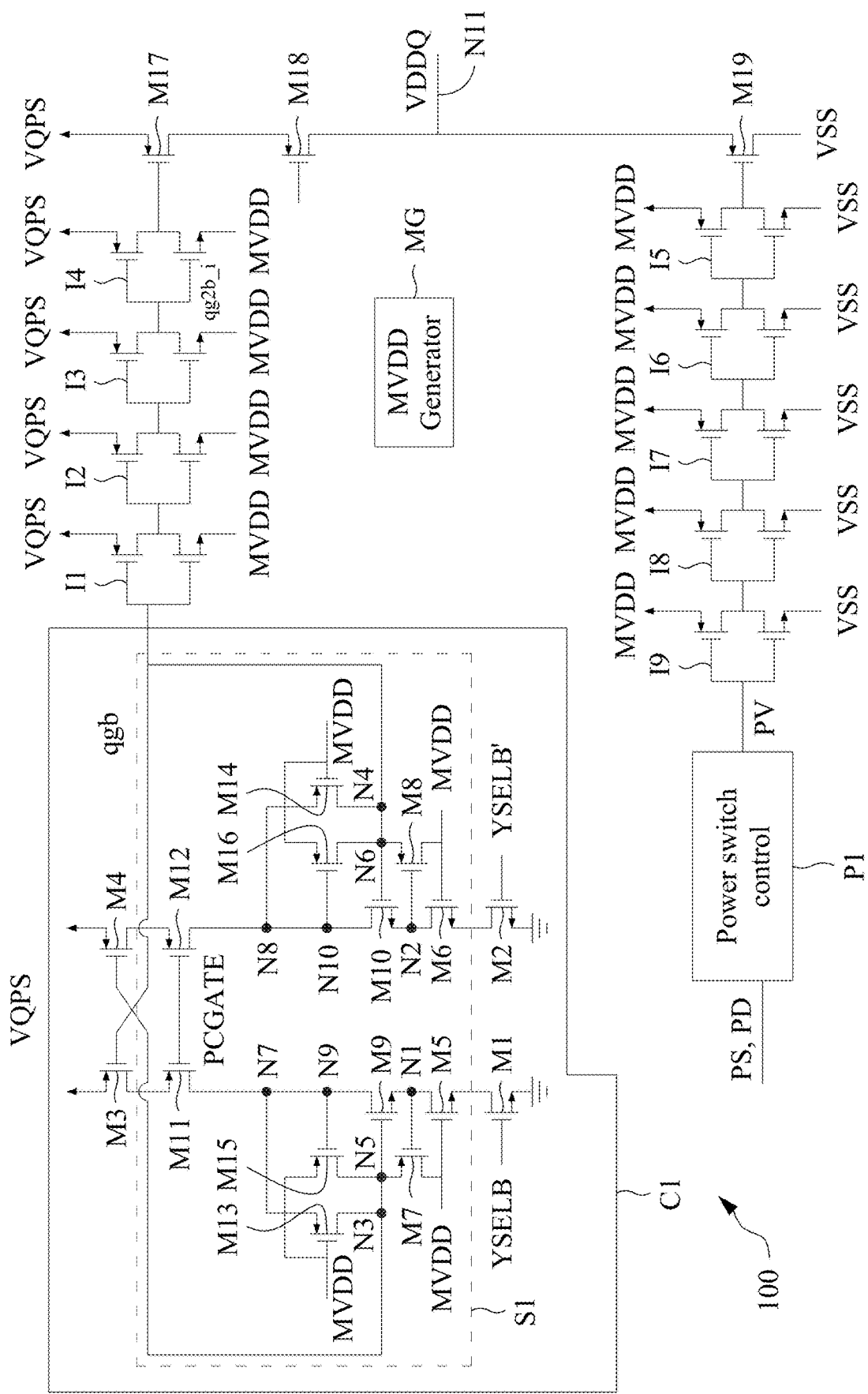
FIG. 1 illustrates an example circuit diagram of a voltage provision circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the ever increasing pace to advance to the next generation nodes, such advanced nodes can offer various advantages, for example, higher speed, higher density, lower power, etc. However, the advanced node does not always offer an input-output (I/O) device or otherwise devices with large channel lengths. For example, in some advanced nodes, almost all of the transistors formed on a die are implemented as core devices (configured in, e.g., gate-all-around (GAA) transistor structures). In comparison with I/O devices, such a core device can indeed have a higher speed, operate under a lower voltage, and be formed in a higher density, but it is generally more susceptible to being overstressed and damaged.

For example, I/O needs of a system typically deal with transferring signals between integrated circuit dies and component connections having large capacitances, such as those associated with printed circuit board traces, cables etc., that require larger driving power and voltage than the signaling occurring within the integrated circuit die. I/O devices interface the faster, smaller signals of a main die to these other, higher capacitance components, and typically transfer the signals at higher voltages. As a non-limiting example, a memory circuit (e.g., an eFuse memory circuit or otherwise one-time programmable (OTP) memory circuit) typically relies on an I/O circuit to provide a high voltage for operation of the memory circuit (e.g., programing, erasing, etc.).

A level shifter is one of various such I/O circuits that can provide a high voltage. In general, a level shifter can shift a level of signal from one power supply domain to another power supply domain. By implementing the level shifter with only core devices in the existing technologies, device reliability issues can arise. For example, during the operation of such an existing level shifter, the voltage drop from gate to drain, from gate to source, and/or from drain to source of each of the core device may be high (e.g., higher than a maximum stress voltage of the core device). This can damage the level shifter, and in turn negatively affect the operation of a coupled circuit. Thus, the existing level shifters have not been entirely satisfactory in many aspects.

The present disclosure provides various embodiments of a voltage provision circuit that utilizes only core devices. The voltage provision circuit, as disclosed herein, includes a voltage provision circuit configured to generate a first intermediate signal based on a fractional voltage, which is a fraction of a supply voltage, and a second intermediate signal based on one or more control signals. In various embodiments, the first intermediate signal can have its opposite logic states (i.e., logic "1" and logic "0") corresponding to the supply voltage and the fractional voltage, respectively, and the second intermediate signal can have its opposite logic states corresponding to the fractional voltage and a ground voltage, respectively. Further, the disclosed voltage provision circuit can include a plurality of serially coupled first inverters and a plurality of serially coupled second inverters that utilize the first and second intermediate signals as inputs, respectively. Based on the first and second intermediate signals, the voltage provision circuit can provide a voltage output that is equal to either the supply voltage or the ground voltage. In various embodiments, each of the core devices included in the disclosed voltage provision circuit has a voltage drop across any of its two terminals less than or equal to the fractional voltage. As such, the stress issues that the existing level shifters commonly face can be entirely avoided in the disclosed voltage provision circuit.

FIG. 1 illustrates an example circuit diagram of a voltage provision circuit 100, in accordance with various embodiments. The voltage provision circuit 100 includes a voltage level shifter C1, a power switch control circuit P1, a fractional voltage generator MG, a number of first inverters I1-I4, and a number of second inverters I5-I9. In general, the fractional voltage generator MG can provide a fractional voltage of a supply voltage for the voltage level shifter C1. The voltage level shifter C1 can generate, based on the fractional voltage, a first intermediate signal with its opposite logic states corresponding to the supply voltage and the fractional voltage, respectively. The power switch control circuit P1 can generate a second intermediate signal with its opposite logic states corresponding to the fractional voltage and a ground voltage, respectively. The first inverters I1-I4 and the second inverters I5-I9 can then input the first intermediate signal and the second intermediate signal, respectively, to collectively determine a voltage level at an output node of the voltage provision circuit 100.

The voltage level shifter C1 includes a voltage modulation circuit (voltage multi structure) S1 coupled between PMOS transistors M3 and M4, and NMOS transistors M1 and M2, that is configured to provide an intermediate signal qgb based on control signals YSELB and YSELB'. In various embodiments, the control signal YESLB and YSELB', served as input signals of the voltage provision circuit 100, may each transition within a first voltage domain (e.g., from 0V (VSS) to 0.75V (VDD)). With the voltage level shifter C1, the intermediate signal qgb can be presented with a first logic state corresponding to the supply voltage VQPS or a second logic state corresponding to a fractional voltage MVDD that is a fraction of the supply voltage VQPS. For example, the supply voltage VQPS (received by the voltage provision circuit 100) can be about 1.8V, while the fractional voltage MVDD is about a half of the supply voltage VQPS, i.e., about 0.9V. Stated another way, the control signal YSELB/YSELB' in a first voltage domain (0-0.75V) can be shifted as the intermediate signal qgb in a second voltage domain (0.9-1.8V).

The voltage level shifter C1 includes an NMOS transistor M1 gated with the control signal YSELB and sourced with a ground voltage. The voltage level shifter C1 includes an NMOS transistor M2 gated with the control signal YSELB' complementary to the control signal YSELB and sourced with the ground voltage. The voltage level shifter C1 includes a PMOS transistor M3 sourced with the supply voltage VQPS. The voltage provision circuit 100 includes a PMOS transistor M4 sourced from the supply voltage VQPS.

In particular, the voltage multi structure S1 (of the voltage level shifter C1) includes an NMOS transistor M5 gated with the fractional voltage MVDD and connected to the NMOS transistor M1. The voltage multi structure S1 includes an NMOS transistor M6 gated with the fractional voltage MVDD and connected to the NMOS transistor M2. The voltage multi structure S1 includes a PMOS transistor M7 gated with a drain voltage of the NMOS transistor M6 and drained with the fractional voltage MVDD. The voltage multi structure S1 includes a PMOS transistor M8 gated with a drain voltage of the NMOS transistor M6 and drained with the fractional voltage MVDD. The voltage multi structure S1 includes an NMOS transistor M9 gated with a source voltage of the PMOS transistor M7, which is also coupled to the intermediate signal qgb. The voltage multi structure S1 includes an NMOS transistor M10 gated with a source voltage of the PMOS transistor M8, which is also coupled to the intermediate signal qgb.

In some embodiments, the voltage multi structure S1 includes a PMOS transistor M11 connected to the PMOS transistor M3, and a PMOS transistor M12 connected to the PMOS transistor M4. The PMOS transistors M11 and M12 are commonly gated by signal PCGATE, which can be a fixed voltage (e.g., 0.9V when fractional voltage MVDD is supplied at 0.9V). The voltage multi structure S1 includes a PMOS transistor M13 gated by the fractional voltage MVDD, and a PMOS transistor M14 gated by the fractional voltage MVDD. The voltage multi structure S1 includes a PMOS transistor M15 sourced by the fractional voltage MVDD, and a PMOS transistor M16 sourced by the fractional voltage MVDD.

Further, the voltage provision circuit 100 includes inverters I1, I2, I3, and I4 serially coupled to one another, each of which is coupled between the supply voltage VQPS and the fractional voltage MVDD. The voltage provision circuit 100 includes a PMOS transistor M17 sourced with the supply voltage VQPS and drained with an output voltage VDDQ. The voltage provision circuit 100 includes a PMOS transistor M18 gated with the fractional voltage MVDD, connected to the PMOS transistor M17, and drained with the ground voltage VDDQ. The voltage provision circuit 100 includes an NMOS transistor M19 sourced with the ground voltage and drained with the output voltage VDDQ. The voltage provision circuit 100 further includes the inverters I5, I6, I7, I8, and I9 serially coupled to one another, each of which is coupled between the supply voltage VQPS and the fractional voltage MVDD. The voltage provision circuit 100 includes a power switch control circuit P1 configured to output, based on control signals PS and PD (which are complementary to each other), an intermediate signal PV. In various embodiments, power switch control circuit P1 can also include a level shifter powered by the fractional voltage MVDD, which shifts the control signal PS/PD (e.g., in the first voltage domain, from 0V (VSS) to 0.75V (VDD)) as the intermediate signal PV presented with a first logic state corresponding to the fractional voltage MVDD or a second logic state corresponding to the ground voltage. Stated another way, the control signal PS/PD in the first voltage domain (0-0.75V) can be shifted as the intermediate signal PV in a third voltage domain (0-0.9V).

In various embodiments, such two intermediate signals qgb and PV can be input to the serially coupled inverters I1-I4 and I5-I9, respectively, so as to cause either the supply voltage VQPS or the ground voltage VSS to be output as the output voltage VDDQ. Alternatively stated, the voltage provision circuit 100 can shift a signal from a first voltage domain to a second voltage domain. For example, the voltage provision circuit 100 can convert the control signal YSELB/YSELB', which is in a first voltage domain (0-0.75V), as the intermediate signal qgb, which is in a second voltage domain (0.9-1.8V). Further, with the intermediate signal PV (output by the power switch control circuit P1) in a third voltage domain (0-0.9V), the voltage provision circuit 100 can provide the output voltage VDDQ in a fourth voltage domain (0-1.8V). Example operation of the voltage provision circuit 100 will be described as follows.

To illustrate operation of the disclosed voltage level shifter C1, some of the nodes are referenced as follows. For example in FIG. 1, the voltage multi structure S1 includes a node N1 connected to the drain of the NMOS transistor M5, the gate of the PMOS transistor M7, and the source of the NMOS transistor M9. The voltage multi structure includes a node N2 connected to the drain of the NMOS transistor M6, the gate of the PMOS transistor M8, and the source of the NMOS transistor M10. The voltage multi structure S1 includes a node N3 connected to the gate of the PMOS transistor M4, the drain of the PMOS transistor M13, and the gate of the NMOS transistor M9 The voltage multi structure S1 includes a node N4 connected to the gate of the PMOS transistor M3, the drain of the PMOS transistor M14, and the gate of the NMOS transistor M10. The voltage multi structure S1 includes a node N5 connected to the gate of the PMOS transistor M3, the drain of the PMOS transistor M15, and the gate of the NMOS transistor M9. The voltage multi structure S1 includes a node N6 connected to the gate of the PMOS transistor M3, the drain of the PMOS transistor M16, and the gate of the NMOS transistor M10. The voltage multi structure S1 includes a node N7 connected to the drain of the PMOS transistor M11, the source of the PMOS transistor M13, and the drain of the NMOS transistor M9. The voltage multi structure S1 includes a node N8 connected to the drain of the PMOS transistor M12, the source of the PMOS transistor M14, and the drain of the NMOS transistor M10. The voltage multi structure S1 includes a node N9 connected to the drain of the PMOS transistor M11, the gate of the PMOS transistor M15, and the drain of the NMOS transistor M9. The voltage multi structure S1 includes a node N10 connected to the drain of the PMOS transistor M12, the gate of the PMOS transistor M16, and the drain of the NMOS transistor M10. Node N11, with which the PMOS transistor M18 and the NMOS transistor M19 are commonly drained, outputs the voltage VDDQ from the voltage provision circuit 100.

In response to the control signals YSELB and YSELB' being provided at low (e.g., 0V) and high (e.g., 0.75V), respectively, the low YSELB gate voltage turns off the NMOS transistor M1, and the high YSELB' gate voltage turns on the NMOS transistor M2. The NMOS transistor M2 pulls down its drain voltage to 0V. The NMOS transistor M6, gated by the fractional voltage MVDD, can be turned on, which, pulls down the voltage at the node N2 to 0V. Such 0V at the node N2, gating the PMOS transistor M8, can turn on the PMOS transistor M8. As such, source and drain of the PMOS transistor M8 can be approximately presented with the same voltage (MVDD, e.g., 0.9V). This causes the intermediate signal qgb to be equal to the fractional voltage MVDD, which is logic low.

Concurrently, the control signals PS and PD may be provided to the power switch control circuit P1 as high (e.g., 0.75V) and low (e.g., 0V), respectively. This can allow the power switch control circuit P1 to output the intermediate signal PV equal to the fractional voltage MVDD (e.g., 0.9V), which is logic high. By inputting the intermediate signals qgb (at logic low) and PV (at logic high) to the serially coupled inverters I1-I4 and I5-I9, respectively, the PMOS transistors M17 can be turned on (with the PMOS transistor M18 always being turned on) and the NMOS transistor M19 can be turned off, which allows the supply voltage VQPS to be coupled to the output node N11, i.e., presenting the output voltage VDDQ at VQPS (1.8V). For example, the logic low intermediate signal qgb is inverted and outputted as logic high by the inverter I1, which is further inverted and outputted by the inverter I2 as logic low, which is further inverted and outputted by the inverter I3 as logic high. As such, an output of the inverter I3, qg2b_i, is logic high, and further inverted and outputted by the inverter I4 as logic low to turn on the PMOS transistor M17. Similarly, the logic high intermediate signal PV is inverted and outputted as logic low by the inverter I9, which is further inverted and outputted by the inverter I8 as logic high, and so on. As such, an output of the inverter I6, pstb1, is logic high, and further inverted and outputted by the inverter I5 as logic low to turn off the NMOS transistor M19.

Table I below summarizes respective logic states/voltage levels at some of the nodes of the voltage provision circuit 100.

TABLE I

| Input/Output | PS | PD | VDDQ | YSELB | YSELB' | qgb | qg2b_i | pstb1 |
| --- | --- | --- | --- | --- | --- | --- | --- | --- |
| Logic State/ Voltage | High (e.g., 0.75 V) | Low (e.g., 0 V) | High (e.g., 1.8 V) | Low (e.g., 0 V) | High (e.g., 0.75 V) | Low (e.g., 0.9 V) | High (e.g., 1.8 V) | High (e.g., 0.9 V) |

In response to the control signal YSELB being high (e.g., 0.75V) and the control signal YSELB' being low (e.g., 0V), the high YSELB gate voltage turns on the NMOS transistor M1, and the low YSELB' gate voltage turns off the NMOS transistor M2. The NMOS transistor M1 pulls down its drain voltage to 0V. The NMOS transistor M5, gated by the fractional voltage MVDD, can be turned on, which, pulls down the voltage at the node N1 to 0V. Such 0V at the node N1, gating the PMOS transistor M7, can turn on the PMOS transistor M7. As such, source and drain of the PMOS transistor M7 can be approximately presented with the same voltage (MVDD, e.g., 0.9V). This causes the PMOS transistor M4 to be turned on, which can help pass the supply voltage VQPS (at the source of the PMOS transistor M4) to a source of the PMOS transistor M12 that is gate by the fixed voltage (PCGATE). Accordingly, a drain of the PMOS transistor M12 is about equal to 1.8V, which causes the PMOS transistor M14, gated by the MVDD (e.g., 0.9V), to be turned on and thus causes its drain to be presented at 1.8V. As such, the intermediate signal qgb (tied to the drain of the PMOS transistor M14) is equal to 1.8V (i.e., the supply voltage VQPS), which is logic high.

Concurrently, the control signals PD and PS may be provided to the power switch control circuit P1 as high (e.g., 0.75V) and low (e.g., 0V), respectively. This can allow the power switch control circuit P1 to output the intermediate signal PV equal to the ground voltage (e.g., 0V), which is logic low. By inputting the intermediate signals qgb (at logic high) and PV (at logic low) to the serially coupled inverters I1-I4 and I5-I9, respectively, the PMOS transistors M17 can be turned off and the NMOS transistor M19 can be turned on, which allows the ground voltage to be coupled to the output node N11, i.e., presenting the output voltage VDDQ at ground voltage (0V). For example, the logic high intermediate signal qgb is inverted and outputted as logic low by the inverter I1, which is further inverted and outputted by the inverter I2 as logic high, which is further inverted and outputted by the inverter I3 as logic low. As such, an output of the inverter I3, qg2b_i, is logic low, and further inverted and outputted by the inverter I4 as logic high to turn off the PMOS transistor M17. Similarly, the logic low intermediate signal PV is inverted and outputted as logic high by the inverter I9, which is further inverted and outputted by the inverter I8 as logic low, and so on. As such, an output of the inverter I6, pstb1, is logic low, and further inverted and outputted by the inverter I5 as logic high to turn on the NMOS transistor M19.

Table II below summarizes respective logic states/voltage levels at some of the nodes of the voltage provision circuit 100.

TABLE II

| Input/Output | PS | PD | VDDQ | YSELB | YSELB' | qgb | qg2b_i | pstb1 |
|---|---|---|---|---|---|---|---|---|
| Logic State/ Voltage | Low (e.g., 0 V) | High (e.g., 0.75 V) | Low (e.g., 0 V) | High (e.g., 0.75 V) | Low (e.g., 0 V) | High (e.g., 1.8 V) | Low (e.g., 0.9 V) | Low (e.g., 0 V) |

Figure 2:
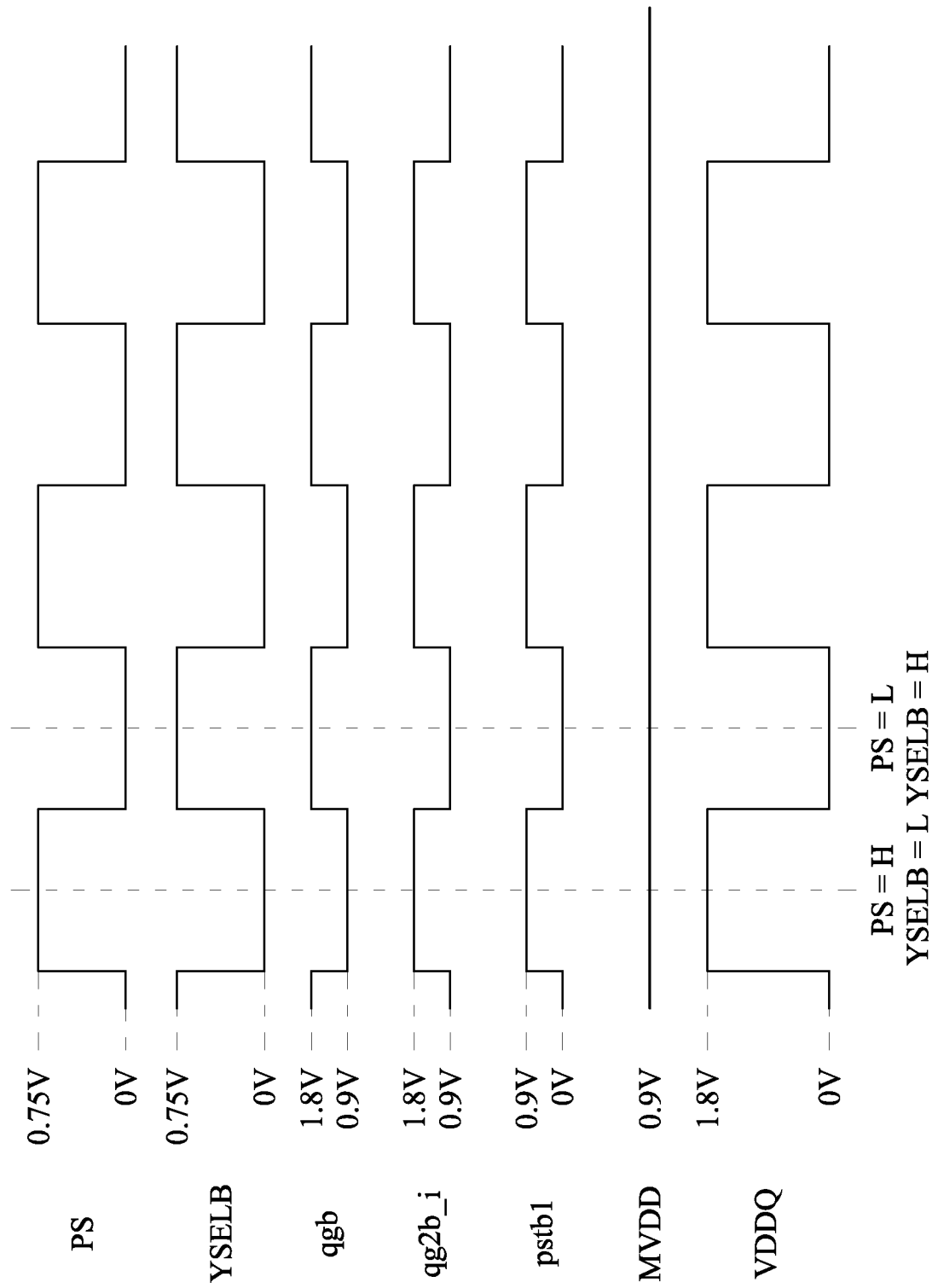
FIG. 2 illustrates waveforms of various signals presented by the voltage provision circuit of FIG. 1, in accordance with some embodiments of the present disclosure.

FIG. 2 illustrate respective waveforms of signals (e.g., voltage levels) over time at the nodes summarized in Tables I and II. For example in FIG. 2, control signal PS, control signal YSELB, intermediate signal qgb, intermediate signal qg2b_i, intermediate signal pstb1, fractional voltage MVDD, and output signal VDDQ are shown. Each of the signals, except for the generated fractional voltage MVDD (which is provide at a relatively fixed level), is a pulse signal transitioning between a low logic state (which corresponds to the lower bound of a corresponding voltage domain) and a high logic state (which corresponds to the higher bound of a corresponding voltage domain). Specifically, the control signals PS and YSELB may each transition between a logic low (e.g., about 0V) and a logic high (e.g., about 0.75V); the intermediate signals qgb and qg2b_i may each transition between a logic low (e.g., about 0.9V) and a logic high (e.g., about 1.8V); the intermediate signal pstb1 may transition between a logic low (e.g., about 0V) and a logic high (e.g., about 0.9V); and the output signal VDDQ may transition between a logic low (e.g., about 0V) and a logic high (e.g., about 1.8V). As a non-limiting example, when the control signal PS is at high and the control signal YSELB is at low, the output signal VDDQ can be equal to about 1.8V (VQPS); and when the control signal PS is at low and the control signal YSELB is at high, the output signal VDDQ can be equal to about 0V (ground).

Figure 3:
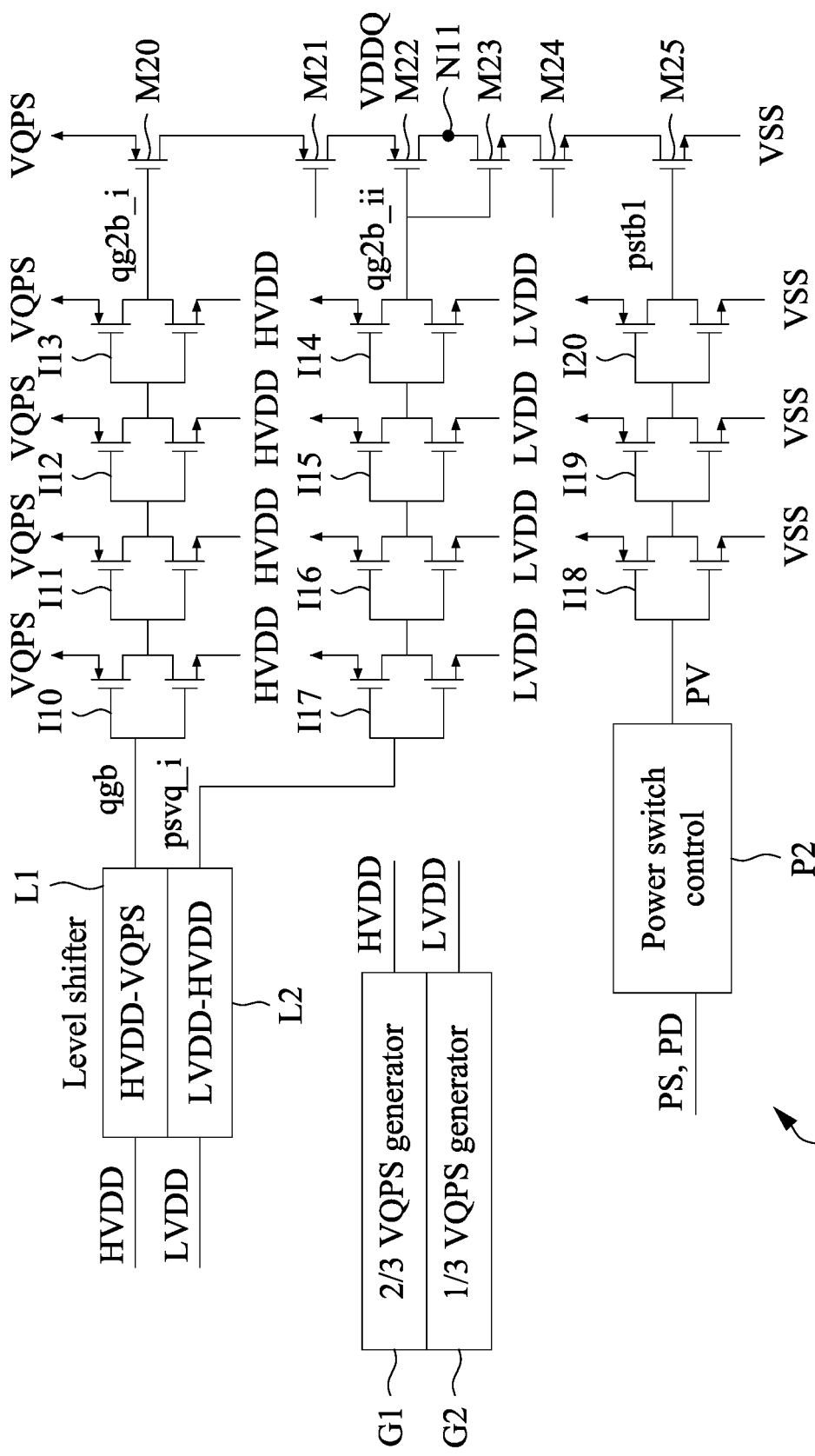
FIG. 3 illustrates an example circuit diagram of another voltage provision circuit, in accordance with some embodiments of the present disclosure.

FIG. 3 illustrates an example circuit diagram of another voltage provision circuit 300, in accordance with some embodiments. The voltage provision circuit 300 is similar to the voltage provision circuit 100 (FIG. 1), except that the voltage provision circuit 300 can provide an output voltage based on more than one fractional voltage. As such, the voltage provision circuit 300 can shift an input voltage to a relatively wider voltage domain (compared to the voltage provision circuit 100), or each of the transistors of the voltage provision circuit 300 can operate with an even lower voltage stress (compared to the voltage provision circuit 100). Thus, the following discussions of voltage provision circuit 300 will be focused on the difference.

For example, the voltage provision circuit 300 includes first and second fractional voltage generators G1 and G2, two voltage level shifters L1 and L2, a power switch control circuit P2, and a first set of serially coupled inverters I10, I11, I12, and I13, a second set of serially coupled inverters I14, I15, I16, and I17, and a third set of serially coupled inverters I18. I19, and I20. The voltage generators G1 and G2 can provide a first fractional voltage HVDD and a second fractional voltage LVDD, respectively. In some embodiments, the supply voltage VQPS (received by the voltage provision circuit 300) can be about 1.8V, while the fractional voltage HVDD is about two thirds of the supply voltage VQPS, i.e., about 1.2V, and the fractional voltage LVDD is about one third of the supply voltage VQPS, i.e., about 0.6V. The fractional voltages HVDD and LVDD can power the level shifters L1 and L2, respectively.

Based on the similar operation principle discussed with respect to the level shifter C1 (of the voltage provision circuit 100 of FIG. 1), the level shifters L1 and L2 can generate a first intermediate signal qgb and a second intermediate signal psyq_i, respectively. For example, the first intermediate signal qgb can be presented with a first logic state corresponding to the supply voltage VQPS or a second logic state corresponding to the fractional voltage HVDD; and the second intermediate signal psvq_i can be presented with a first logic state corresponding to the fractional voltage HVDD or a second logic state corresponding to the fractional voltage LVDD. Similar to the power switch control circuit P1 (of the voltage provision circuit 100 of FIG. 1), the power switch control circuit P2 can generate a third intermediate signal PV with its opposite logic states corresponding to the fractional voltage LVDD and a ground voltage, respectively. Alternatively stated, the first intermediate signal qgb can transition within a first voltage domain, from the fractional voltage HVDD (e.g., 1.2V) to the supply voltage VQPS (e.g., 1.8V); the second intermediate signal psyq_i can transition within a second voltage domain, from the fractional voltage LVDD (e.g., 0.6V) to the fractional voltage HVDD (e.g., 1.2V); and the third intermediate signal PV can transition within a third voltage domain, from ground (e.g., 0V) to the fractional voltage LVDD (e.g., 0.6V).

The first inverters I10-I13, the second inverters I14-I17, and the third inverters I18-I20 each input the first, second, and third intermediate signals, qgb, psvq_i, and PV, respectively, to collectively determine the voltage level, VDDQ, at the output node N11. For example, to output the signal VDDQ at 1.8V (VQPS), the level shifter L1 provides the intermediate signal qgb at logic low (e.g., 1.2V) and the level shifter L2 provides the intermediate signal psyq_i at logic low (e.g., 0.6V), while the power switch control circuit P2 provides the intermediate signal PV at logic high (e.g., 0.6V). As such, intermediate signals qg2b_i and qg2b_ii can be respectively outputted by the first inverters I10-I13 and the second inverters I14-I17 as logic low, which turns on PMOS transistor M20 (with PMOS transistor M21 being on), turns on PMOS transistor M22 and turns off NMOS transistor M23 (with NMOS transistor M24 being off). Intermediate signal pstb1 can be outputted by the third inverters I18-20 as logic low, which turns off NMOS transistor M25. Consequently, the supply voltage VQPS (e.g., 1.8V) can be passed to the node N11 as the output signal VDDQ, through the turned-on transistors M20, M21, and M22, while keeping the node N11 decoupled from ground through the turned-off transistors M23, M24, and M25.

On the other hand, to output the signal VDDQ at 0V (ground), the level shifter L1 provides the intermediate signal qgb at logic high (e.g., 1.8V) and the level shifter L2 provides the intermediate signal psvq_i at logic high (e.g., 1.2V), while the power switch control circuit P2 provides the intermediate signal PV at logic low (e.g., 0V). As such, intermediate signals qg2b_i and qg2b_ii can be respectively outputted by the first inverters I10-I13 and the second inverters I14-I17 as logic high, which turns off the PMOS transistor M20, turns off the PMOS transistor M22 and turns on the NMOS transistor M23. The intermediate signal pstb1 can be outputted by the third inverters I18-20 as logic high, which turns on the NMOS transistor M25. Consequently, the output signal VDDQ can be coupled to the ground voltage, through the turned-on transistors M23, M24, and M25, while keeping the node N11 decoupled from the supply voltage VQPS through the turned-off transistors M20, M21, and M22.

Figure 4:
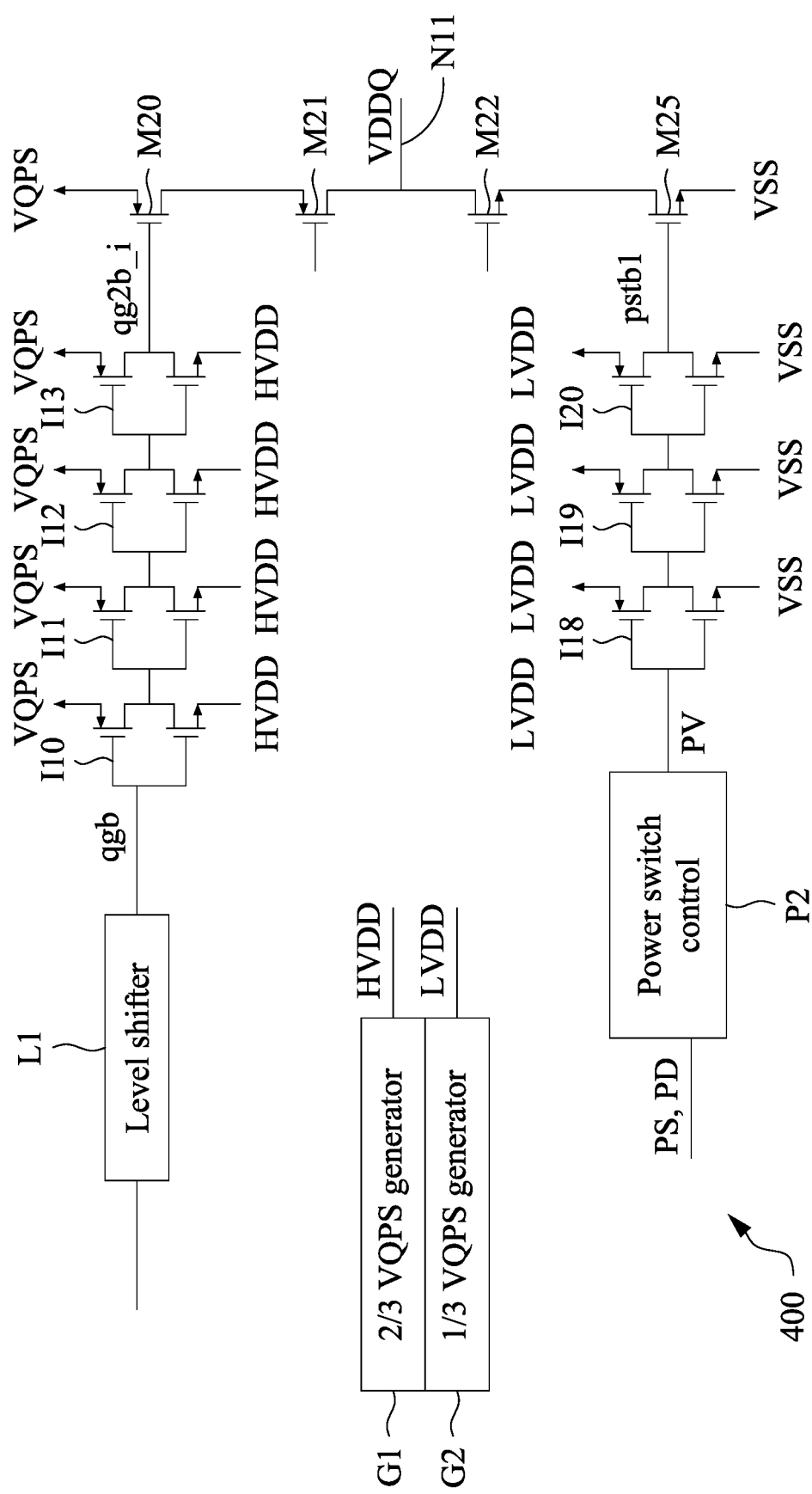
FIG. 4 illustrates an example circuit diagram of yet another voltage provision circuit, in accordance with some embodiments of the present disclosure.

FIG. 4 illustrates an example circuit diagram of yet another voltage provision circuit 400, in accordance with some embodiments. The voltage provision circuit 400 is similar to the voltage provision circuit 300 (FIG. 3), except that, even with two voltage generators, the voltage provision circuit 400 may have one level shifter. As such, the voltage provision circuit 400 can also shift an input voltage to a relatively wider voltage domain (compared to the voltage provision circuit 100), or each of the transistors of the voltage provision circuit 400 can operate with an even lower voltage stress (compared to the voltage provision circuit 100). Thus, the following discussions of voltage provision circuit 400 will be focused on the difference.

For example, the voltage provision circuit 400 includes first and second fractional voltage generators G1 and G2, one voltage level shifter L1, a power switch control circuit P2, and a first set of serially coupled inverters I10, I11, I12, and I13, and a second set of serially coupled inverters I18, I19, and I20. The voltage generators G1 and G2 can provide a first fractional voltage HVDD and a second fractional voltage LVDD, respectively. In some embodiments, the supply voltage VQPS (received by the voltage provision circuit 300) can be about 1.8V, while the fractional voltage HVDD is about two thirds of the supply voltage VQPS, i.e., about 1.2V, and the fractional voltage LVDD is about one third of the supply voltage VQPS, i.e., about 0.6V. The fractional voltage HVDD and the fractional voltage LVDD can power the level shifters L1 and L2, respectively.

Based on the similar operation principle discussed with respect to the level shifter C1 (of the voltage provision circuit 100 of FIG. 1), the level shifter L1 can generate a first intermediate signal qgb based on the fractional voltage HVDD. For example, the first intermediate signal qgb can be presented with a first logic state corresponding to the supply voltage VQPS or a second logic state corresponding to the fractional voltage HVDD. Similar to the power switch control circuit P1 (of the voltage provision circuit 100 of FIG. 1), the power switch control circuit P2 can generate a second intermediate signal PV with its opposite logic states corresponding to the fractional voltage LVDD and a ground voltage, respectively. Alternatively stated, the first intermediate signal qgb can transition within a first voltage domain, from the fractional voltage HVDD (e.g., 1.2V) to the supply voltage VQPS (e.g., 1.8V); and the second intermediate signal PV can transition within a second voltage domain, from ground (e.g., 0V) to the fractional voltage LVDD (e.g., 0.6V).

The first inverters I10-I13 and the second inverters I18-I20 each input the first and second intermediate signals, qgb and PV, respectively, to collectively determine the voltage level, VDDQ, at the output node N11. For example, to output the signal VDDQ at 1.8V (VQPS), the level shifter L1 provides the intermediate signal qgb at logic low (e.g., 1.2V), while the power switch control circuit P2 provides the intermediate signal PV at logic high (e.g., 0.6V). As such, intermediate signals qg2b_i can be outputted by the first inverters I10-I13 as logic low, which turns on PMOS transistor M20 (with PMOS transistor M21 being on). Intermediate signal pstb1 can be outputted by the third inverters I18-20 as logic low, which turns off NMOS transistor M25. Consequently, the supply voltage VQPS (e.g., 1.8V) can be passed to the node N11 as the output signal VDDQ, through the turned-on transistors M20 and M21, while keeping the node N11 decoupled from ground through the turned-off transistor M25.

On the other hand, to output the signal VDDQ at 0V (ground), the level shifter L1 provides the intermediate signal qgb at logic high (e.g., 1.8V), while the power switch control circuit P2 provides the intermediate signal PV at logic low (e.g., 0V). As such, intermediate signals qg2b_i can be outputted by the first inverters I10-I13 as logic high, which turns off the PMOS transistor M20. The intermediate signal pstb1 can be outputted by the third inverters I18-20 as logic high, which turns on the NMOS transistor M25. Consequently, the output signal VDDQ can be coupled to the ground voltage, through the turned-on transistors M22 and M25, while keeping the node N11 decoupled from the supply voltage VQPS through the turned-off transistor M20.

Figure 5:
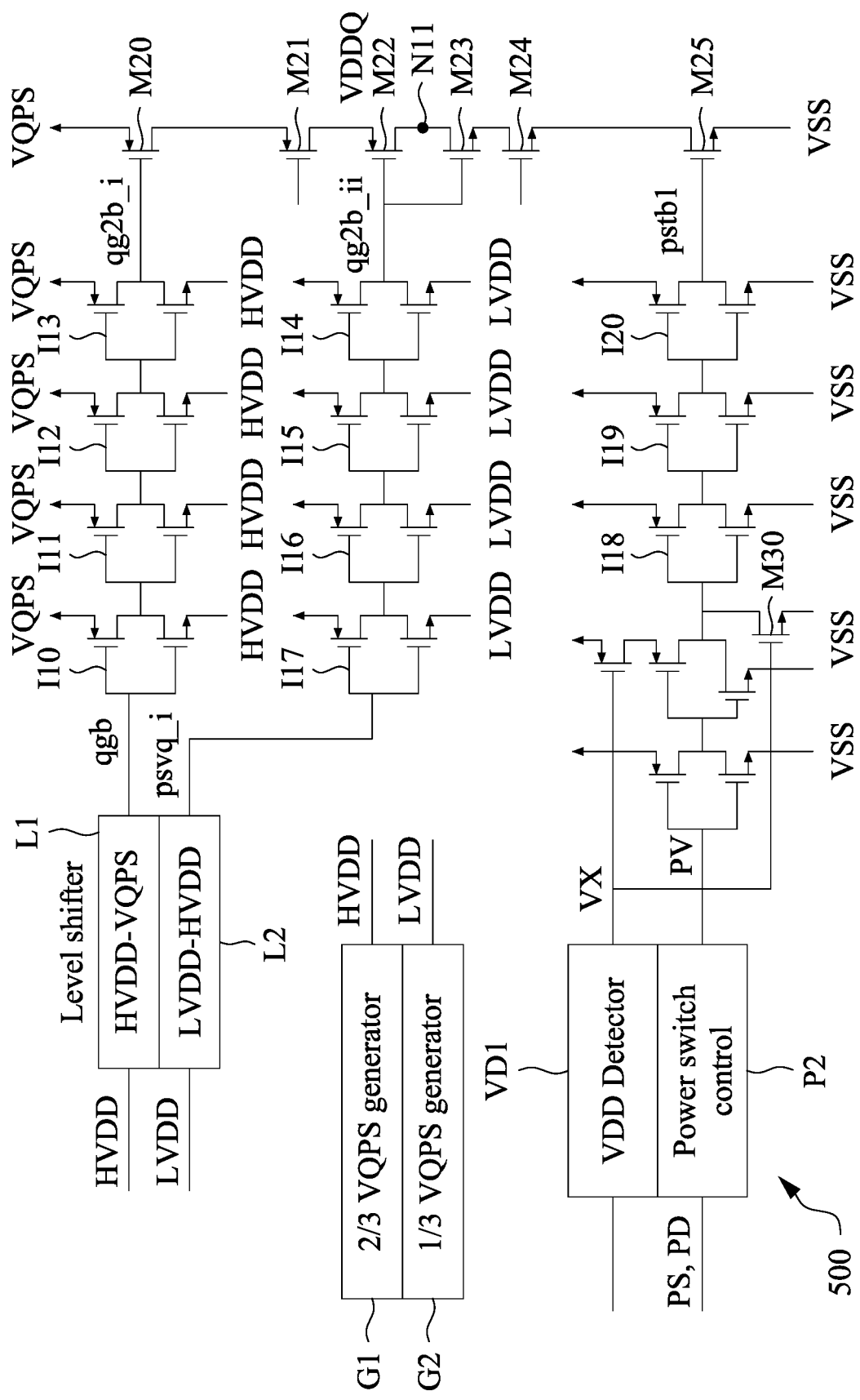
FIG. 5 illustrates an example circuit diagram of yet another voltage provision circuit, in accordance with some embodiments of the present disclosure.

FIG. 5 illustrates an example circuit diagram of yet another voltage provision circuit 500, in accordance with some embodiments. The voltage provision circuit 500 is similar to the voltage provision circuit 300 (FIG. 3), except that the voltage provision circuit 500 may further include a voltage detector. As such, the voltage provision circuit 500 can also shift an input voltage to a relatively wider voltage domain (compared to the voltage provision circuit 100), or each of the transistors of the voltage provision circuit 500 can operate with an even lower voltage stress (compared to the voltage provision circuit 100). Thus, the following discussions of voltage provision circuit 500 will be focused on the difference.

In various embodiments, the voltage provision circuit 500 includes a voltage detector VD1 configured to detect whether a relatively low logic voltage VDD, driving the control signals (e.g., YSELB, YSELB', PS, PD, etc.), is ready or otherwise stable when compared to the supply voltage VQPS. For example, if the logic voltage VDD is not ready while supply voltage VQPS has been provided, the voltage detector VD1 can forcibly pull the output signal VDDQ to ground. In some embodiments, the voltage detector VD1, which is essentially comprised of a number of inverters with relatively weak PMOS transistors, can output another intermediate signal Vx based on comparing a voltage level of the logic voltage VDD with a voltage level of the supply voltage VQPS. In response to determining that the logic voltage VDD is not ready, the voltage detector VD1 outputs the intermediate signal Vx at logic high. As such, regardless of the intermediate signal PV being outputted as a logic high or low, the inverter I18 can receive a logic low, which is pulled to the ground voltage by NMOS transistor M30 that is turned on by the high intermediate signal Vx. Consequently, the intermediate signal pstb1 can be outputted at logic high, which turns on the NMOS transistor M25 to pull the output signal VDDQ to ground.

Figure 6:
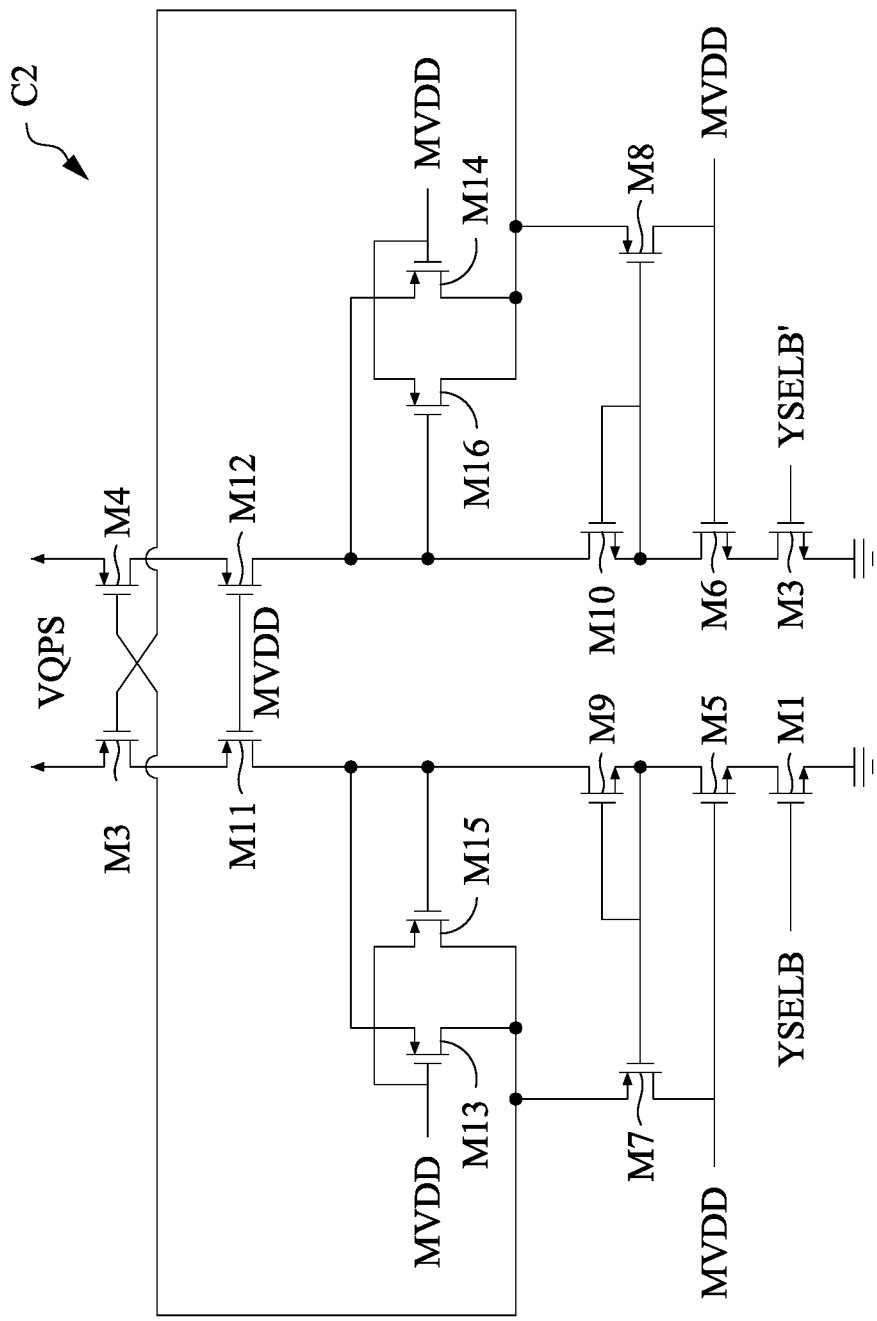
FIG. 6 illustrates an example circuit diagram of a voltage level shifter that can be implemented by any of the voltage provision circuits of FIGS. 1 and 3-5, in accordance with some embodiments of the present disclosure.

FIG. 6 illustrates an example circuit diagram of another voltage level shifter C2, in accordance with various embodiments. The voltage level shifter C2 is similar to the voltage level shifter C1 (FIG. 1) with some connections among the NMOS transistors M9 and M10 being changed. Thus, the following discussions will be focused on the difference. As shown, the gate of the NMOS transistor M10 is connected to the gate of the PMOS transistor M8, rather than being connected to the source of the PMOS transistor M8 (FIG. 1). Similarly, the gate of the NMOS transistor M9 is connected to the gate of the PMOS transistor M7, rather than being connected to the source of the PMOS transistor M7 (FIG. 1).

Figure 7:
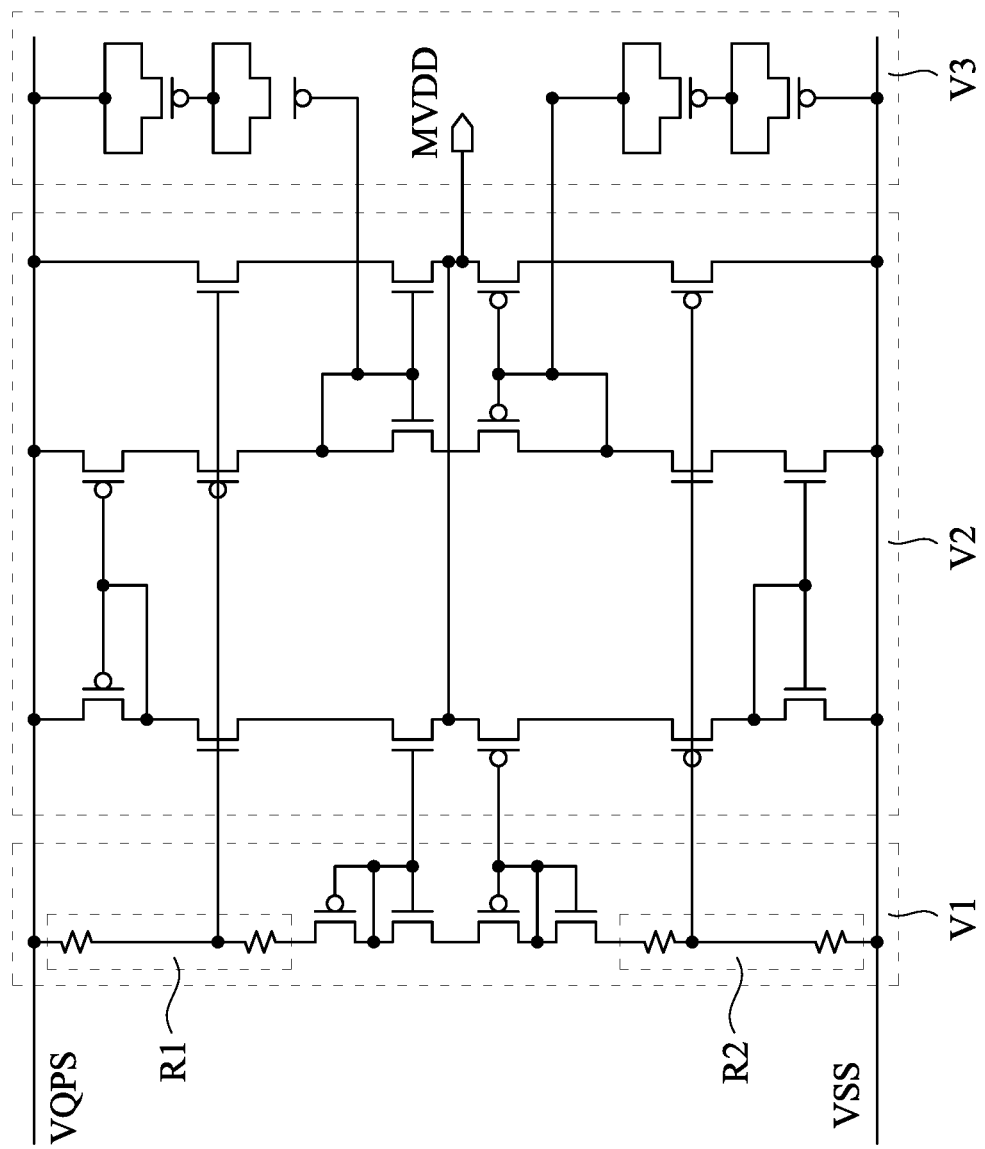
FIG. 7 illustrates an example circuit diagram of a fractional voltage generator that can be implemented by the voltage provision circuit of FIG. 1, in accordance with some embodiments of the present disclosure.

FIG. 7 illustrates an example circuit diagram of a voltage generator 700, which can be one of various implementations of the voltage generator MG (FIG. 1). The voltage generator 700 can generate a fractional voltage (e.g., MVDD) based on a supply voltage (e.g., VQPS) and a ground voltage (e.g., VSS).

As shown, the voltage generator 700 includes a first section V1, a second section V2, and a third section V3. The first section V1 may serve as a power divider, the second section V2 may serve as a push/pull driver, and the third section V3 may be configure to stabilize the output, i.e., the fractional voltage MVDD. In some embodiments, the first section V1 includes two sets of resistors R1 and R2, a number of NMOS transistors, and a number of PMOS transistors that are configured to collectively generate a bias; the second section V2 includes a number of NMOS transistors and a number of PMOS transistors that are configured to collectively to pull or push the output; and the third section V3 includes a number of MOS capacitors that are configured to collectively stabilize the output. In some other embodiments, each of the resistors may be implemented as a MOS diode, while remaining within the scope of the present disclosure. Generally, the fractional voltage MVDD is equal to a ratio of the first set of resistors R1 to the second set of resistors R2, multiplied by the supply voltage VQPS:

$$MVDD = N \times VQPS$$

where coefficient N is defined as:

$$R2/(R1+R2)$$

For example, when R1/R2 is equal to 1, N is equal to ½. As such, MVDD is equal to ½×VQPS. In another example, when R1/R2 is equal to ½, N is equal to ⅔. As such, MVDD is equal to ⅔×VQPS. When R1/R2 is equal to two, N is equal to ⅓. As such, MVDD is equal to ⅓×VQPS.

Figure 8:
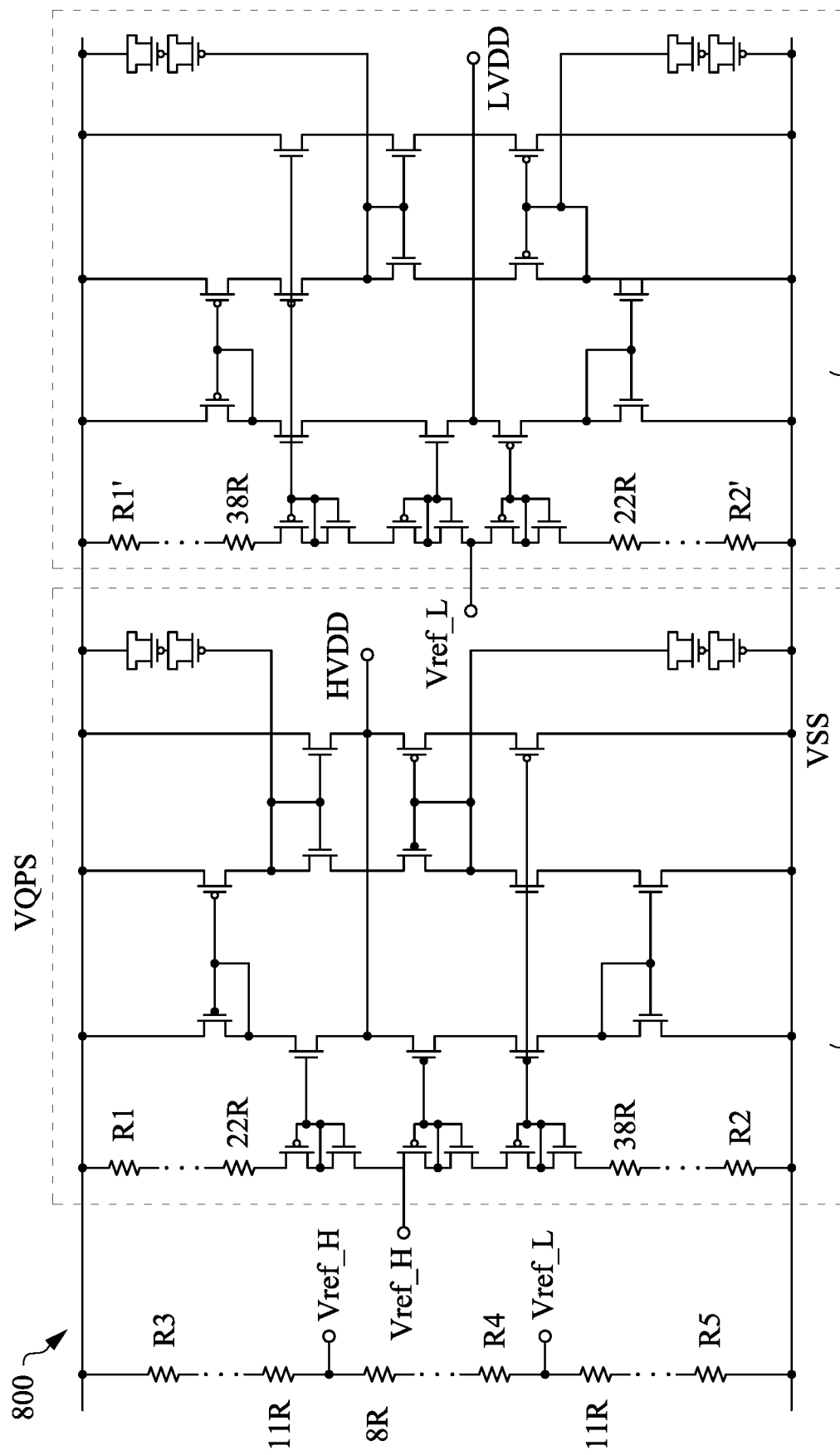
FIG. 8 illustrates an example circuit diagram of a fractional voltage generator that can be implemented by any of the voltage provision circuit of FIGS. 3-5, in accordance with some embodiments of the present disclosure.

FIG. 8 illustrates an example circuit diagram of a voltage generator 800, which can be one of various implementations of a combination of the voltage generators G1 and G2 (FIGS. 3, 4, and 5). The voltage generator 800 can generate multiple fractional voltages (e.g., HVDD and LVDD) based on a supply voltage (e.g., VQPS) and a ground voltage (e.g., VSS). The voltage generator 800 is similar to the voltage generator 700, and thus, the following discussion of the voltage generator 800 will be focused on the difference.

As shown, the voltage generator 800 includes a combination of two voltage generators 810 and 850, each of which is similar to the voltage generator 700 (e.g., including three sections operatively coupled to each other). For example, the voltage generator 810 can provide a first fractional voltage HVDD based on a ratio of first set of resistors R1 to a second set of resistors R2, multiplied by the supply voltage VQPS; and the voltage generator 850 can provide a second fractional voltage LVDD based on a ratio of first set of resistors R1' to a second set of resistors R2', multiplied by the supply voltage VQPS. As a non-limiting example, the ratio of R1 to R1+R2 (22 to 60) may be around 0.36 and the ratio of R2 to R1+R2 (38 to 60) may be around 0.63, which causes the outputs HVDD and LVDD to be around 0.6V and 1.2V, respectively (when VQPS=1.8V). Further, the voltage generator 800 includes a voltage divider, also coupled between the supply voltage VQPS and ground voltage, to provide reference voltages Vref H and Vref L to the voltage generators 810 and 850, respectively. In some embodiments, the voltage divider can include three sets of resistors R3, R4, and R5. Continuing with the above example, a ratio of the these three sets of resistors R3 to R4 to R5 may be 11:8:11.

Figure 9:
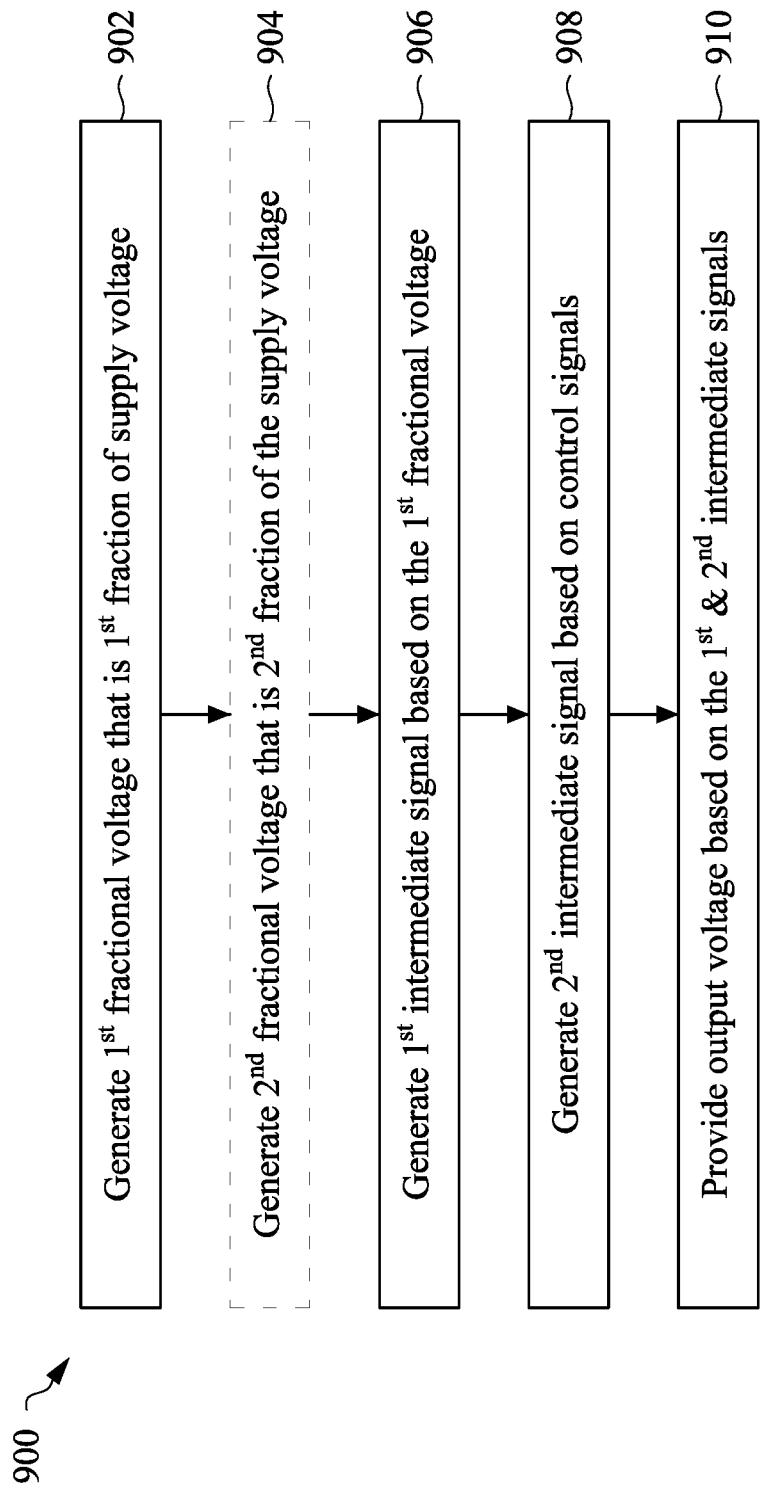
FIG. 9 illustrates a flowchart of an example method top operate the disclosed voltage provision circuit, in accordance with some embodiments of the present disclosure.

FIG. 9 illustrates a flowchart of an example method 900 to operate the disclosed voltage provision circuit, in accordance with various embodiments. It is noted that the method 900 is merely an example, and is not intended to limit the present disclosure. Accordingly, it is understood that any additional operations may be provided during, before, and after the method 900 of FIG. 9, and that some other operations may only be briefly described herein. The method 900 may be utilized to operate the voltage provision circuit 100, 300, 400, or 500, and thus, operations of the method 900 will be discussed in conjunction with the components discussed in FIGS. 1-8.

In brief overview, the method 900 starts with operation 902 of generating a first fractional voltage that is a first fraction of a supply voltage. The method 900 continues to optional operation 904 of generating a second fractional voltage that is a second fraction of the supply voltage. The method 900 continues to operation 906 of generating, based at least on the first fractional voltage, a first intermediate signal. The method 900 continues to operation 908 of generating, based at least on one or more control signals, a second intermediate signal. The method 900 continues to operation 910 of providing, based on the first and second intermediate signals, an output voltage. In various embodiments, the output voltage is presented with either the supply voltage or a ground voltage.

Corresponding to operation 902 of FIG. 9, a first fractional voltage, which is first fraction of a supply voltage, can be generated by a voltage generator. For example in FIG. 1, the voltage generator MG of the voltage provision circuit 100 (FIG. 1) can generate a fractional voltage MVDD, which is a fraction of a supply voltage VQPS. In various embodiments, such a fractional voltage MVDD can allow each of transistors of the disclosed voltage level shifter C1 (FIG. 1) or C2 (FIG. 6) to operate under a relatively low voltage stress, e.g., under 1V. As such, each of the transistors, regardless of being implemented as NMOS or PMOS, can be implemented as a core device with a relatively thin gate dielectric while being immune from high voltage stress.

Corresponding to optional operation 904 of FIG. 9, another fractional voltage, which is a second fraction of the supply voltage, can be generated by another voltage generator. For example in FIGS. 3-5, first and second fractional voltages can be generated by the voltage generators G1 and G2, respectively. Such multiple fractional voltages can allow each of transistors of the one (L1 of FIG. 4) or multiple (L1 and L2 of FIG. 3 or 5) disclosed voltage level shifters to operate under a relatively low voltage stress, e.g., under 1V. In the following discussions of the method 900, the example of single fractional voltage (e.g., FIG. 1) will be mainly used.

Corresponding to operation 906 of FIG. 9, a first intermediate signal can be generated by a voltage level shifter. Continuing with the example of FIG. 1, the voltage level shifter C1 can generate the intermediate signal qgb based on the first fractional voltage MVDD (together with a pair of control signals, YSELB and YELB'). In various embodiments, with the help of level shifter C1, the control signals YESLB and TESLB' (in a first voltage domain, e.g., from 0V to 0.75V) can be shifted or otherwise outputted as the intermediate signal qgb, which is in a different second voltage domain, e.g., from the fractional voltage MVDD (0.9V) to the supply voltage VQPS (1.8V), while keeping each of the transistors of level shifter C1 experiencing with a relatively low voltage stress (e.g., not greater than 0.9V).

Corresponding to operation 908 of FIG. 9, a second intermediate signal can be generated by a power switch control circuit. Continuing with the example of FIG. 1, the power switch control circuit P1 can generate the intermediate signal PV based on the first fractional voltage MVDD (together with a pair of control signals, PS and PD). In various embodiments, the power switch control circuit P1 may also include a voltage level shifter, powered by the fractional voltage MVDD, that can shift or otherwise output the control signals PS/PD (from the first voltage domain, e.g., from 0V to 0.75V) as the intermediate signal PV, which is in a different third voltage domain, e.g., from ground (0V) to the fractional voltage MVDD (0.9V).

Corresponding to operation 910 of FIG. 9, an output voltage can be provided based on the first and second intermediate signals. Continuing with the example of FIG. 1, the first intermediate signal qgb and second intermediate signal PV can be inputted to a first set of serially coupled inverters (e.g., I1 to I4) and a second set of serially coupled inverters (e.g., I5 to I9), respectively. With the first and second intermediate signals configured at suitable logic states, the output voltage can be provided in a fourth voltage domain, e.g., from ground (0V) to the supply voltage VQPS (1.8V), while keeping each of the transistors of inverters I1 to I9 experiencing with a relatively low voltage stress (e.g., not greater than 0.9V).

Referring again to the voltage provision circuit 100 of FIG. 1, multiple voltage multi structures S1 can be "stacked" between the PMOS transistors M3-M4 and the NMOS transistors M1-M2 to deal with an even higher supply voltage VQPS (so as to output the voltage VDDQ with a wider voltage level), while keeping each of the transistors experiencing a relatively low voltage stress (e.g., not greater than 0.9V). Alternatively stated, a level of the supply voltage VQPS may be positively proportional to a number of the stacked voltage multi structures S1. For example, when the supply voltage VQPS is equal to about 1.8V, the voltage provision circuit 100 may include one voltage multi structure S1 (as shown in FIG. 1). In another example, when the supply voltage VQPS is equal to about 3.6V, the provision circuit 100 may include two voltage multi structures S1 stacked between the PMOS transistors M3-M4 and the NMOS transistors M1-M2.

In one aspect of the present disclosure, a voltage provision circuit is disclosed. The voltage provision circuit includes a first NMOS transistor gated with a first control signal and sourced with a ground voltage. The voltage provision circuit includes a second NMOS transistor gated with a second control signal complementary to the first control signal and sourced with the ground voltage. The voltage provision circuit includes a first PMOS transistor sourced with a first supply voltage. The voltage provision circuit includes a second PMOS transistor sourced with the first supply voltage. The voltage provision circuit includes a voltage modulation circuit, coupled between the first to second PMOS transistors and the first to second NMOS transistors, that is configured to provide a first intermediate signal based on the first and second control signals. In some embodiments, the first intermediate signal has a first logic state corresponding to the first supply voltage and a second logic state corresponding to a second supply voltage that is a fraction of the first supply voltage. The voltage provision circuit includes a power switch control circuit configured to output a third intermediate signal presented with a first logic state corresponding to the second supply voltage or a second logic state corresponding to the ground voltage.

In another aspect of the present disclosure, a circuit is disclosed. The circuit includes a first fractional voltage generator configured to generate a first voltage that is a first fraction of a supply voltage. The circuit includes a first level shifter, powered by the supply voltage, which is configured to generate a first intermediate signal based on the first voltage. The circuit includes a plurality of first inverters, coupled between the supply voltage and the first voltage, that are configured to cause, based on the first intermediate signal, the supply voltage to be coupled to an output node. The circuit includes a plurality of second inverters, coupled between the first voltage and a ground voltage or between a second voltage and the ground voltage, that are configured to cause the output node to be coupled to the ground voltage, wherein the second voltage is a second fraction of the supply voltage.

In yet another aspect of the present disclosure, a method of operation of a circuit is disclosed. The method includes receiving a first fractional voltage that is a first fraction of a supply voltage. The method includes providing, based on the first fractional voltage, a first intermediate signal presented with a first logic state corresponding to the supply voltage or a second logic state corresponding to the first fractional voltage. The method includes outputting, based on the first intermediate signal, an output voltage that is either the supply voltage or a ground voltage.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first NMOS transistor gated with a first control signal and sourced with a ground voltage;
a second NMOS transistor gated with a second control signal complementary to the first control signal and sourced with the ground voltage;
a first PMOS transistor sourced with a first supply voltage;
a second PMOS transistor sourced with the first supply voltage;
a voltage modulation circuit, coupled between the first to second PMOS transistors and the first to second NMOS transistors, that is configured to provide a first intermediate signal based on the first and second control signals, wherein the first intermediate signal is presented with a first logic state corresponding to the first supply voltage or a second logic state corresponding to a second supply voltage that is a fraction of the first supply voltage;
a power switch control circuit configured to output a third intermediate signal presented with a first logic state corresponding to the second supply voltage or the second logic state corresponding to the ground voltage; and
an even number of first inverters serially coupled to one another, each of which is coupled between the first supply voltage and the second supply voltage, wherein the first inverters are configured to output a second intermediate signal based on the first intermediate signal.

2. The circuit of claim 1, further comprising:
an odd number of second inverters serially coupled to one another, each of which is coupled between the second supply voltage and the ground voltage;
wherein the second inverters are configured to output a fourth intermediate signal based on the third intermediate signal.

3. The circuit of claim 2, further comprising:
a third PMOS transistor gated with the second intermediate signal, sourced with the first supply voltage, and drained with an output voltage.

4. The circuit of claim 3, further comprising:
a third NMOS transistor gated with the fourth intermediate signal, sourced with the ground voltage, and drained with the output voltage.

5. The circuit of claim 4, wherein the output voltage is configured to be in a first logic state in response to the third PMOS transistor being turned on and the third NMOS transistor being turned off, and the output voltage is configured to be in a second logic state in response to the third PMOS transistor being turned off and the third NMOS transistor being turned on.

6. The circuit of claim 1, wherein an output voltage is presented with a first logic state corresponding to the first supply voltage or a second logic state corresponding to the ground voltage.

7. The circuit of claim 1, wherein the voltage modulation circuit includes:
a fourth NMOS transistor gated with the second supply voltage and connected to the first NMOS transistor;
a fifth NMOS transistor gated with the second supply voltage and connected to the second NMOS transistor;
a fourth PMOS transistor gated with a drain voltage of the fourth NMOS transistor and drained with the second supply voltage;
a fifth PMOS transistor gated with a drain voltage of the fifth NMOS transistor and drained with the second supply voltage;
a sixth NMOS transistor gated with an inverse signal of the first intermediate signal; and
a seventh NMOS transistor gated with a source voltage of the fifth PMOS transistor, which is also coupled to the first intermediate signal.

8. The circuit of claim 7, wherein each of the first to seventh NMOS transistors and the first to fifth PMOS transistors has a voltage drop across any two of its terminals less than 1 volt.

9. The circuit of claim 1, wherein each of the transistors has the same gate oxide thickness.

10. A circuit, comprising:
a first NMOS transistor gated with a first control signal and sourced with a ground voltage;
a second NMOS transistor gated with a second control signal that is complementary to the first control signal and sourced with the ground voltage;
a first PMOS transistor sourced with a first supply voltage;
a second PMOS transistor also sourced with the first supply voltage;
a voltage modulation circuit, coupled between the first to the second PMOS transistors and the first to the second NMOS transistors, and configured to provide a first intermediate signal based on the first and second control signals, wherein the first intermediate signal is presented with a first logic state corresponding to the first supply voltage or a second logic state corresponding to a second supply voltage that is a fraction of the first supply voltage; and
an even number of first inverters serially coupled to one another, each of which is coupled between the first supply voltage and the second supply voltage, wherein the first inverters are configured to output a second intermediate signal based on the first intermediate signal.

11. The circuit of claim 10, wherein an output voltage is presented with the second logic state corresponding to the ground voltage.

12. The circuit of claim 10, further comprising:
a power switch control circuit configured to output a third intermediate signal presented with a first logic state corresponding to the second supply voltage or the second logic state corresponding to the ground voltage.

13. The circuit of claim 10, further comprising:
an odd number of second inverters serially coupled to one another, each of which is coupled between the second supply voltage and the ground voltage;
wherein the second inverters are configured to output a fourth intermediate signal based on the third intermediate signal.

14. The circuit of claim 13, further comprising:
a third PMOS transistor gated with the second intermediate signal, sourced with the first supply voltage, and drained with an output voltage.

15. The circuit of claim 14, further comprising:
a third NMOS transistor gated with the fourth intermediate signal, sourced with the ground voltage, and drained with the output voltage, wherein the output voltage is configured to be in a first logic state in response to the third PMOS transistor being turned on and the third NMOS transistor being turned off, and the output voltage is configured to be in a second logic state in response to the third PMOS transistor being turned off and the third NMOS transistor being turned on.

16. A voltage provision circuit, comprising:
a first NMOS transistor gated with a first control signal and sourced with a ground voltage;
a second NMOS transistor gated with a second control signal that is complementary to the first control signal and sourced with the ground voltage;
a first PMOS transistor sourced with a first supply voltage;
a second PMOS transistor also sourced with the first supply voltage;
a voltage modulation circuit, coupled between the first to the second PMOS transistors and the first to the second NMOS transistors, and configured to provide a first intermediate signal based on the first and second control signals, wherein the first intermediate signal is presented with a first logic state corresponding to the first supply voltage or a second logic state corresponding to a second supply voltage that is a fraction of the first supply voltage; and
an even number of first inverters serially coupled to one another, each of which is coupled between the first supply voltage and the second supply voltage, wherein the first inverters are configured to output a second intermediate signal based on the first intermediate signal.

17. The circuit of claim 16, further comprising:
a power switch control circuit configured to output a third intermediate signal presented with a first logic state corresponding to the second supply voltage or a second logic state corresponding to the ground voltage.

18. The circuit of claim 10, wherein each of the transistors has the same gate oxide thickness.

19. The circuit of claim 16, wherein each of the transistors has the same gate oxide thickness.

20. The circuit of claim 16, further comprising:
an odd number of second inverters serially coupled to one another, each of which is coupled between the second supply voltage and a ground voltage.

* * * * *